United States Patent

Mirabel et al.

[11] Patent Number: 5,675,539
[45] Date of Patent: Oct. 7, 1997

[54] METHOD AND CIRCUIT FOR TESTING MEMORIES IN INTEGRATED CIRCUIT FORM

[75] Inventors: Jean-Michel Mirabel, Cabries; Emilio Yero, Aix-en-Provence, both of France

[73] Assignee: SGS-Thomson Microelectronics, S.A., Gentilly Cedex, France

[21] Appl. No.: 575,953

[22] Filed: Dec. 21, 1995

Related U.S. Application

[60] Provisional application No. 60/007,718 Nov. 30, 1995.

[30]   Foreign Application Priority Data

Dec. 21, 1994 [FR] France ................................. 94 15430

[51] Int. Cl.⁶ ............................................... G11C 11/34
[52] U.S. Cl. ...................... 365/185.25; 365/203; 365/201
[58] Field of Search ........................... 365/185.25, 201, 365/203, 208

[56]   References Cited

U.S. PATENT DOCUMENTS

| | | | |
|---|---|---|---|
| 5,175,705 | 12/1992 | Iwahashi | 365/185.25 |
| 5,361,232 | 11/1994 | Petschauer et al. | 365/201 |
| 5,453,954 | 9/1995 | Nakamura | 365/201 |

FOREIGN PATENT DOCUMENTS 0462876  12/1991  European Pat. Off. .

*Primary Examiner*—A. Zarabian
*Attorney, Agent, or Firm*—Robert Groover; Betty Formby; Matthew Anderson

[57]   ABSTRACT

An integrated circuit memory that contains a device for the precharging and reading of the bit lines, including a precharging element, a current-voltage converter and a read circuit, further contains a test circuit to isolate the output of the converter from the precharging element and from the read circuit, to apply a test voltage to a cell of the memory through the converter and to measure the current in the cell.

22 Claims, 2 Drawing Sheets

METHOD AND CIRCUIT FOR TESTING MEMORIES IN INTEGRATED CIRCUIT FORM

CROSS-REFERENCE TO RELATED APPLICATION

This application claims priority from French App'n 94-15430, filed Dec. 12, 1994, which is hereby incorporated by reference, and from a provisional application of the present inventors entitled "Method and Circuit for Testing Memories in Integrated Circuit Form", SN 60/007,718, filed Nov. 30, 1995 (Atty. docket BA-0099P). However, the content of the present application is not necessarily identical to that of the priority applications.

BACKGROUND AND SUMMARY OF THE INVENTION

The invention relates to the testing of memories made in integrated circuit form. The invention can be applied especially but not exclusively to electrically programmable memories whose basic cell is a floating gate transistor (EPROM, E$_2$PROM, flash EPROM).

The characterizing of a memory cell implies the plotting of its curve i=f(v). The method used for this is a particular mode of access to the cell called direct access mode.

It may be recalled that the cells of integrated circuit memories are arranged in matrix form. A word line (directly or by means of selection transistors) activates the gates of the cells located on one and the same row. The state of a cell is read on a bit line connected to the drains of the cell located with this cell on one and the same column.

When a cell has to be read, its address is given to a decoder of the memory which selects the corresponding word line to apply a read voltage to the gate of the cell and selects the corresponding bit line to connect it to a precharging and reading device.

This precharging and reading device conventionally has a current-voltage converter that gives, at output, a voltage level varying greatly with the input current. To put it in a simplified way, if the cell is feebly conductive, the output voltage of the converter will be high. If the cell is highly conductive, this output voltage will be low. This output voltage is applied to a read circuit comprising, for example, a differential amplifier that gives a binary output. The precharging and reading circuits also comprises a precharging element (resistor or transistor) that is activated upon the detection of the loading of an address to inject current into the current-voltage converter which thus servo-links the (capacitive) bit line to a precharging voltage. In this way, the read access time is accelerated.

To characterize a memory cell, this cell must be isolated from the elements to which it is normally connected, to prevent any external disturbance. Thus, the precharging and reading device is separated in order to impose a variable testing voltage directly on the bit line. The corresponding current on this line is measured. For this purpose, a circuit is generally designed to inhibit the precharging and reading device in a test. When this circuit is activated, if the cell is addressed in reading mode (address signals, memory selection, read control), it is possible to make a direct reading of the current on the bit line as a function of the testing voltage applied thereto. The characteristic curve i=f(v) is obtained as a function of the intrinsic parameters of the cell. This enables a detection of possible weaknesses and, if necessary, the discarding of the memory. It is possible to apply the testing voltage and measure the current by means of a probe applied to a testing point of the bit line. It is preferred to provide for at least one transistor for the short-circuiting of the precharging and reading device to make a direct connection of the bit line to an access pad of the memory. Thus, the testing voltage is applied and the current is measured directly at the input/output pin associated with the precharging and reading device that is being tested.

In practice, this characterization has proved to be insufficient to prevent certain memory malfunctions.

An object of the invention is to improve the testing of the memory cells, since it has now been realized that the testing method does not take account of the technological variations resulting from the manufacturing methods used.

Now, in reading mode, a memory cell is biased in the linear operating zone (for example, for a flash EPROM memory cell, about 5 volts are placed at its gate and 1 volt at its drain). In this operating zone, a small variation of the drain voltage (on the bit line) leads to a high variation in current.

This drain voltage is dictated by the precharging and reading device and more particularly by the current-voltage converter. The servo-control characteristics of the converter however are not precisely defined owing to the technological variations intrinsic to the method of manufacture of the integrated circuit memory. Now, if the drain voltage is for example slightly higher it will let more current into the cell and on the bit line. This could ultimately, after repeated access in reading mode, damage the cells, reducing the lifetime of the memory.

The technological variations may also affect the current response of the precharging element.

An object of the invention is a memory in integrated circuit form with a precharging and reading device that includes a testing circuit to take account of these different factors, capable of influencing the operational behavior of a memory cell.

The disclosed inventions propose a memory in integrated circuit form organized as a matrix in rows and columns and comprising at least one precharging and reading device associated with one or more rows, this device comprising a precharging element, a current-voltage converter and a read circuit, the selection of an associated row activating the precharging element and connecting the input of the converter to the row, the output of the converter being connected to the precharging element and to the input of the read circuit.

According to the invention, the precharging and reading device furthermore comprises a test circuit to isolate the output of the converter from the precharging element and from the reading circuit, apply a test voltage to the output of the converter and measure a current at this output.

Another object of the invention is a method to measure the current of a cell of a memory in integrated circuit form comprising a device for the precharging and reading of the memory cell, this device comprising a precharging element, a current-voltage converter and a read circuit, the selection of the cell activating the precharging element and connecting the input of the converter to the row, the output of the converter being connected to the precharging element and to the input of the read circuit. According to this method, the output of the converter is used to apply a testing voltage and to carry out the current measurement therein while the precharging element and the reading circuit are set in the inactive state.

Advantageously, there is furthermore provision for reading the current-voltage characteristic of the precharging element alone.

BRIEF DESCRIPTION OF THE DRAWING

Other characteristics and advantages of the invention are given in the following description, made by way of an indication that in no way restricts the scope of the invention, with reference to the appended drawings of which.

DETAILED DESCRIPTION OF THE PREFERRED EMBODIMENTS

As will be recognized by those skilled in the art, the innovative invention. Concepts described in the present application can be modified and varied over a tremendous range of applications, and accordingly the scope of patented subject matter is not limited by any of the specific exemplary teachings given. For example, as will be obvious to those of ordinary skill in the art, other circuit elements can be added to, or substituted into, the specific circuit topologies shown.

Figure 1:
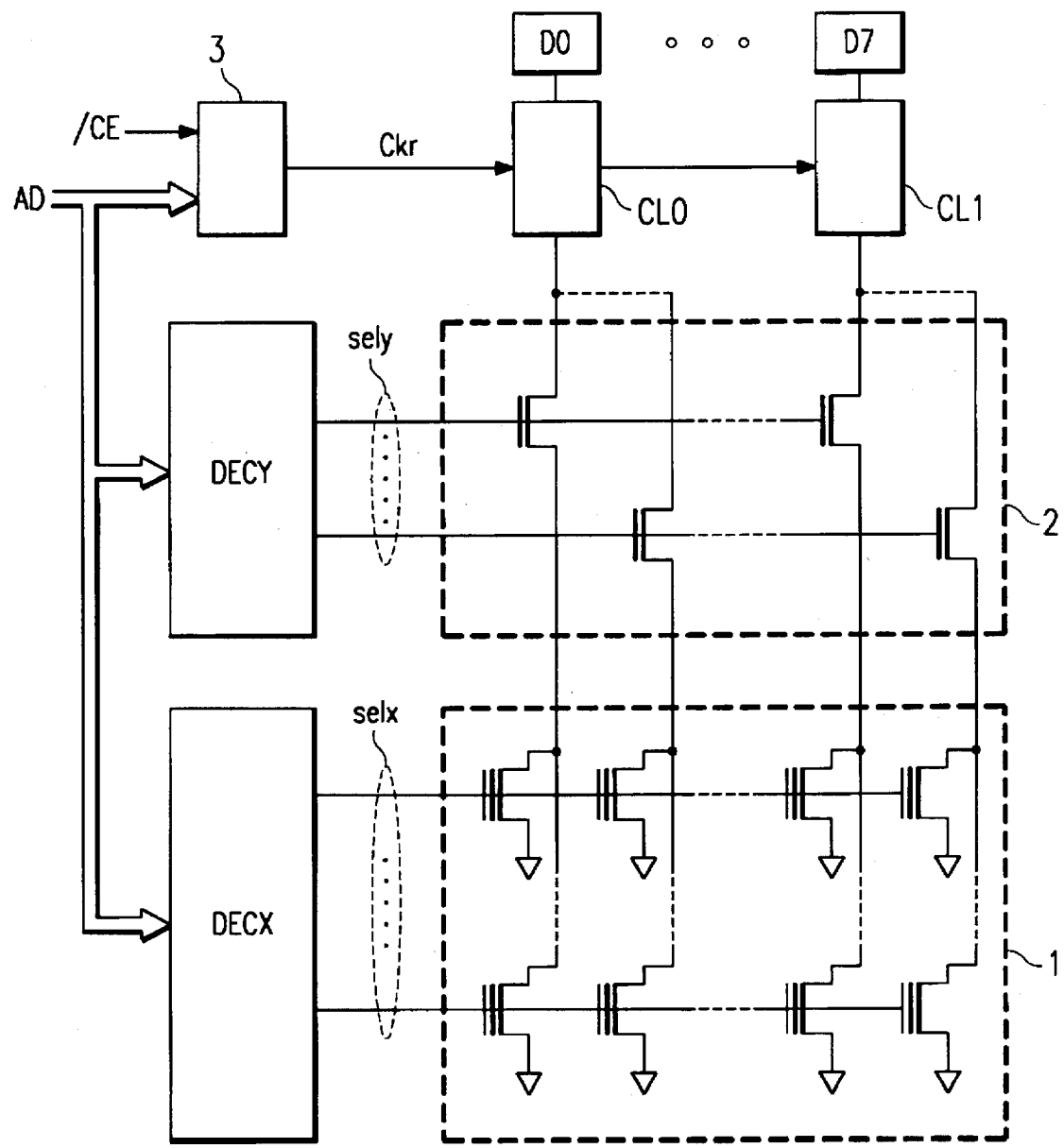
FIG. 1 shows an example of the architecture of a memory in integrated circuit form.

FIG. 1 shows an array of memory cells 1 arranged in matrix form in bit lines and word lines, a logic gate circuit 2 controlled by a bit line decoder (DECY) to select (sely) one or more bit lines (8 in the example) and connect each of them to an associated precharging and reading device (Cl0, ..., Cl7).

The memory array is furthermore controlled by a word line decoder (DECX) for the selection of a word line (selx).

A circuit 3 for the detection of address transitions that receives the memory selection signals/CE and the signals from the address bus AD gives a signal Ckr to activate or trigger the precharging and reading devices (Cl0, ..., Cl7) as soon as a new address is detected.

Figure 2:
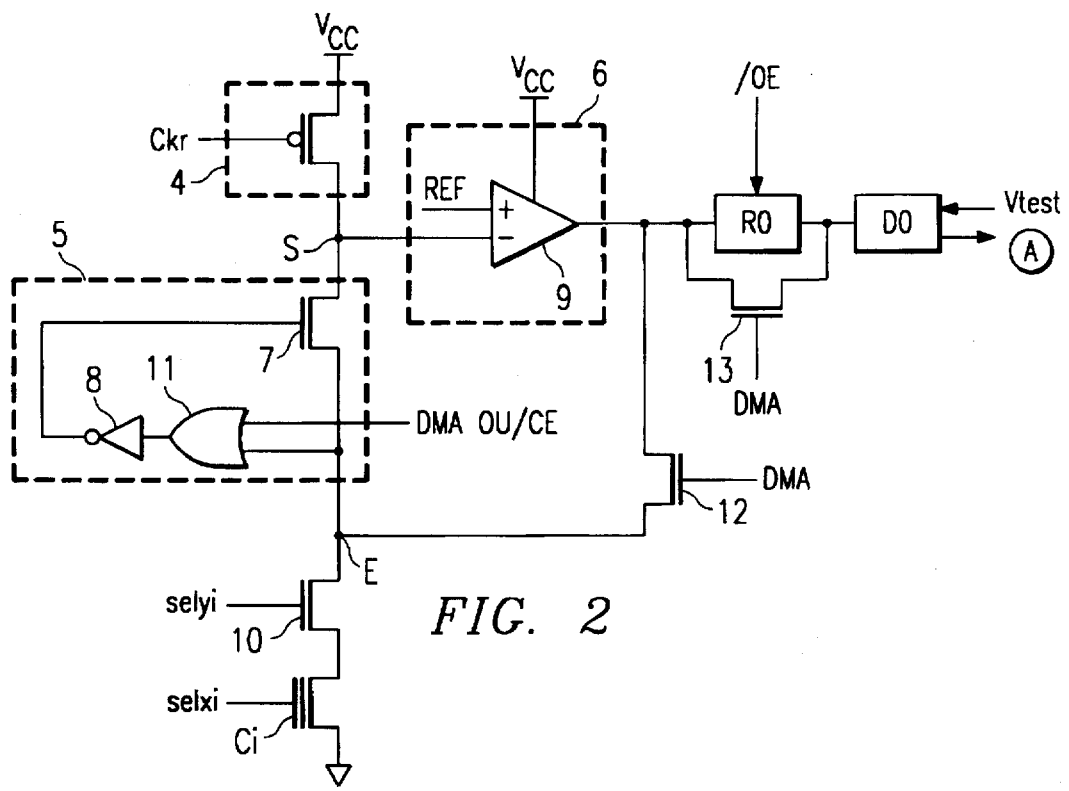
FIG. 2 shows a precharging and reading device associated with a bit line of a memory in integrated circuit form and a testing circuit according to the prior art.

A precharging and reading device is shown in detail in FIG. 2. It has a precharging element 4 connected between the logic supply voltage Vcc and the output S of a current-voltage converter 5 and a read circuit 6 connected to the output S of the converter to deliver a binary signal at an output register R0 associated with an input/output pin D0 of the integrated circuit memory.

In a conventional way, the precharging element 4 has a resistive element. In the simple example shown, the precharging element is a P type MOS transistor whose source is connected to the logic supply voltage Vcc and whose drain is connected to the output S of the converter. It is placed in the On state by the activation signal Ckr applied in the example directly to its gate.

The current-voltage converter 5 conventionally includes a transistor 7 series-connected between the input E and the output S of the converter and an inverter 8 between the input of the converter and the gate of the transistor 7. This simple assembly is a servo-link setting up, at the input of the converter, a precharging voltage linked to the technological characteristics of the transistor 7 and the inverter 8. In the example shown, the transistor 7 is an N type MOS transistor having its source connected to the input E and its drain connected to the output S.

The read circuit 6 typically has a comparator type circuit 9 with a reference value ref. It may include, after the comparator, amplifiers or inverters (not shown).

The read circuit 6 is generally connected at its output to a three-state output register R0 associated with the input pin D0: an inactive state (1) of an output validation signal /OE sets the output of the register in a high impedance state. An active state (0) transmits the logic information at the output of the read circuit to the pin D0.

The input E of the converter is actively connected to a bit line selected by a transistor 10 of the logic gate circuit 2 of FIG. 1, controlled by a signal selyi of the bit line decoder DECY (FIG. 1). The other bit lines, if any, connected to this same input E are necessarily de-selected.

A cell Ci of the bit line selected in read mode (selxi) has a corresponding read voltage (of the order of 5 volts for a flash EPROM cell) applied to its gate.

When the cell is addressed in reading mode, it is selected and the activation or triggering signal Ckr is generated: the precharging circuit gives an injection current to the current-voltage converter which servo-links the selected bit line (li) to a precharging voltage. The cell Ci gives a certain current as a function of its state, whether programmed or not. This current causes the converter to react. A voltage is set up at output of the converter. This voltage is compared with the reference by the comparator which gives the corresponding binary in formation element 0 or 1 at output. This binary information element is transmitted to the pin D0 by the activation of the output enable signal /OE. According to the prior art, and as shown in FIG. 2, to plot the curve i=f(v) of a cell, the read precharging circuit is usually cut off. For this purpose, there is generally provided a logic gate before the inverter 8 of the current-voltage converter.

In the example of FIG. 2, since the transistor 7 of the current-voltage converter is an N type transistor, its gate must be set at zero to turn it off. In this case, the logic gate is an OR gate 11 that receives the test signal DMA at input and the input E of the converter. The activation of the test signal DMA (at 1) sets the transistor 7 of the converter 8 in the off state, thus cutting off the input from the output of the converter (FIG. 2). The signal used as the test signal DMA is generally the signal for the selection of the memory /CE which is set at 1.

To use the input/output pin associated with the precharging and reading device as a test terminal, there is provided a transistor 12 to short-circuit the precharging and reading device in test mode. In practice, a second short-circuit transistor is also used to short-circuit the associated output register R0. It is alternatively possible to use a single transistor to short-circuit the entire unit formed by the precharging and reading device and the output register. However, the use of the two short-circuit transistors 12 and 13 is advantageous. Indeed, the precharging and reading device is generally placed close to the memory cells, located topologically at the center of the integrated circuit, while the output register will be located rather at the periphery, close to the input/output pins. Since it is not desirable to make a large number of lengthy connections, it would be preferable to locally short-circuit the different elements.

Finally, for the test, the output enable signal /OE is placed in the high state to set the output of the output register R0 in a state of high impedance.

It is then possible to directly apply a test voltage (variable) Vtest to the input/output pin and measure the current therein.

Figure 3:
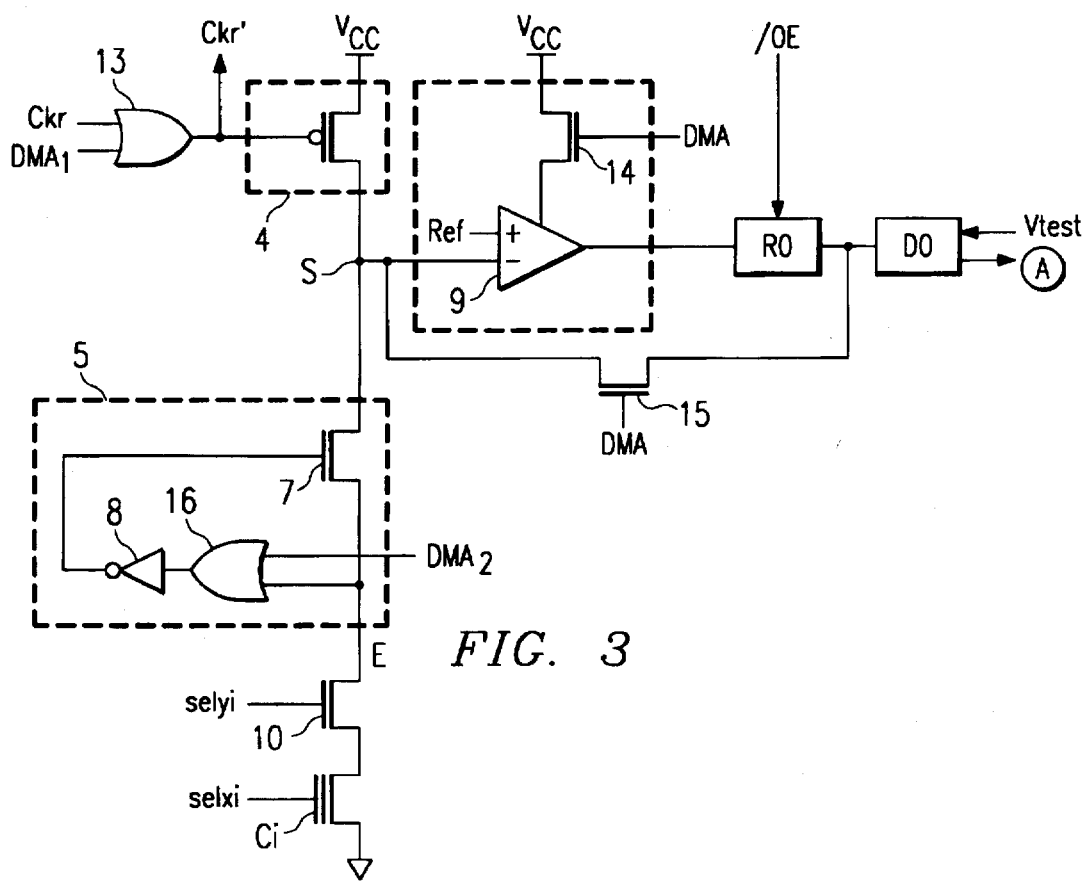
FIG. 3 shows a precharging and reading device comprising a testing circuit according to the invention.

According to the invention and as shown in FIG. 3, instead of planning to short-circuit the entire unit, there is provided a test circuit that enables the application of a test voltage to the output S of the converter and the measurement therein of the current, in cutting off the precharging element and the reading circuit.

In the example of FIG. 3, the testing circuit has also a logic gate 13 to set the activation signal Ckr, applied to the precharging element 4, in the inactive state (as it happens 0). In the example, this is an OR gate that receives a first testing signal DMA1 and the activation signal Ckr and delivers an enabled activation signal for the precharging and reading device referenced Ckr'. It may be noted that a single logic gate is sufficient for the entire memory: the signal Ckr' is applied to all the precharging devices.

The testing circuit also has a transistor 14 to isolate the read circuit from the output S of the converter 5. The transistor is, for example, connected between the logic supply Vcc and the read circuit, and is controlled by a test signal referenced DMA in the figure. Preferably, to use the input/output pin D0 as a test terminal, there is provided a transistor 15 connected between the output S of the converter and the pin D0 and controlled by the same test signal DMA. Instead of the transistor 15 shown in FIG. 3, it is possible to provide for a first transistor parallel-connected with the read circuit and a second transistor parallel-connected with the associated output register, as already explained with reference to FIG. 2.

According to the invention, the method for measuring current consists in:

addressing the memory cell Ci: this generates the activation signal Ckr, and selects (selxi, selyi) the cell, applying the test signals to inhibit the precharging element (DMA1) and the read circuit (DMA), applying the test voltage (Vtest) to the output 5 of the converter and measuring the current therein.

In the preferred case where the input/output pin D0 is used to apply the testing voltage and measure the current, the output validation signal /OE is held in the inactive state (1) to place the output of the output register in a high impedance state and the test signal DMA is used to short-circuit the read circuit (6) and the output register (R0). The test signal DMA to inhibit the read circuit (or even short-circuit it), and the test signal DMA1 to inhibit the precharging element, are preferably different: this enables the measurement of the current of the precharging element as a function of the test voltage applied as previously. The test circuit then further includes a logic gate 16 to impose a locking voltage on the gate of the transistor of the converter.

For example, an OR gate 16 is placed before the inverter 8 of the converter. This OR gate receives the input of the converter and a test signal DMA2 that will be set, in the example, at 1 during the testing of the precharging element.

With this improvement, it is possible to perform a first test by activating the test signals DMA and DMA1 to measure the current of the memory cell selected and biased through the converter and a second test by activating the signals DMA and DMA2 to measure the current of the precharging element alone.

The test signals DMA, DMA1 and DMA2 are applied by probes. At least one may be controlled by the selection pin of the memory (/CE), for example the signal DMA that is used in both tests.

It is then possible to know the true behavior of each cell of the integrated circuit memory. This increases the reliability of the memory, permitting a more thorough testing method.

According to another disclosed class of innovative embodiments, there is provided: An integrated circuit memory, comprising: an array of memory cells arranged in rows and columns; one or more precharging/reading subcircuits, each operatively connected to at least one respective column of said array of memory cells, and each comprising: a current-to-voltage converter having an input terminal connected to be driven by a current signal from said respective column, and having an output terminal connected to provide a voltage signal corresponding to said current signal, a precharging circuit connected to selectably drive said voltage signal toward a power supply voltage, a read circuit connected to detect the voltage of said voltage signal and provide a corresponding digital output, a first bypass transistor connected to selectably bypass said read circuit under control of a first test-mode control signal; and an output terminal operatively connected to said digital output; wherein said precharging circuit is controlled in dependence both on a clock signal and also on a second test-mode control signal.

According to the present application, there is also provided: An integrated circuit, comprising: an array of memory cells arranged in rows and columns; one or more precharging/reading subcircuits, each operatively connected to at least one respective column of said array of memory cells, and each comprising: a current-to-voltage converter having an input terminal connected to be driven by a current signal from said respective column, and having an output terminal connected to provide a voltage signal corresponding to said current signal when an enable signal is active, a precharging circuit connected to selectably drive said voltage signal toward a power supply voltage, a read circuit connected to detect the voltage of said voltage signal and provide a corresponding digital output through an output register, a first bypass transistor connected to selectably bypass said read circuit and said output register under control of a first test-mode control signal; and an output terminal operatively connected to said digital output; wherein said precharging circuit is controlled in dependence both on a clock signal and also on a second test-mode control signal.

According to a disclosed class of innovative embodiments, there is provided: An integrated circuit memory, comprising: an array of memory cells; and one or more precharging/reading subcircuits, each selectably connected to multiple respective multi-cell portions of said array of memory cells, and each comprising: an impedance element having an input terminal connected to be driven by said respective portion of said array, and having an output terminal connected to provide a voltage signal which indicates signals received at said input terminal; a precharging circuit connected to selectably drive said voltage signal toward a power supply voltage, a read circuit connected to detect the voltage of said voltage signal and provide a corresponding digital output, a first bypass transistor connected to selectably bypass said read circuit under control of a first test-mode control signal; and an output terminal operatively connected to said digital output; wherein said precharging circuit is controlled in dependence both on a clock signal and also on a second test-mode control signal.

According to another disclosed class of innovative embodiments, there is provided: A memory in integrated circuit form organized as a matrix in rows and columns and comprising: at least one precharging and reading device associated with one or more rows, said device comprising a precharging element, a current-voltage converter and a read circuit, the selection of an associated row activating the precharging element and connecting the input of said converter to said row, the output of said converter being connected to the precharging element and to the input of the read circuit; and a test circuit connected to isolate the output of the converter from the precharging element and from the reading circuit, apply a test voltage to the output of the converter and measure a current at this output.

According to another disclosed class of innovative embodiments, there is provided: A method to measure the current of a cell of a memory in integrated circuit form comprising a device for the precharging and reading of said memory cell, said device comprising a precharging element, a current-voltage converter and a read circuit, the selection of said cell activating the precharging element and connecting the input of said converter to said row, the output of said converter being connected to the precharging element and to the input of the read circuit, method wherein the output of said converter is used to apply a testing voltage and to carry out said current measurement therein, while the precharging element and the reading circuit are set in the inactive state.

As will be recognized by those skilled in the art, the innovative concepts described in the present application can be modified and varied over a tremendous range of applications, and accordingly the scope of patented subject matter is not limited by any of the specific exemplary teachings given. For example, as will be obvious to those of ordinary skill in the art, other circuit elements can be added to, or substituted into, the specific circuit topologies shown.

What is claimed is:

1. An integrated circuit memory, comprising:

an array of memory cells arranged in rows and columns;

one or more precharging and reading subcircuits, each operatively connected to at least one respective column of said array of memory cells, and each comprising:

a current-to-voltage converter having an input terminal connected to be driven by a current signal from said respective column, and having an output terminal connected to provide a voltage signal corresponding to said current signal, a precharging circuit connected to selectably drive said voltage signal toward a power supply voltage, a read circuit connected to detect the voltage of said voltage signal and provide a corresponding digital output, a first bypass transistor connected to selectably bypass said read circuit, but not said current-to-voltage converter, under control of a first test-mode control signal; and an output terminal operatively connected to said digital output;

wherein said precharging circuit is controlled in dependence both on a clock signal and also on a second test-mode control signal.

2. The integrated circuit of claim 1, wherein said array of memory cells consists of an array of floating-gate memory cells.

3. The integrated circuit of claim 1, wherein each said precharging/reading subcircuit is connected to a plurality of column-select transistors which are each connected to a respective column of said array of memory cells.

4. The integrated circuit of claim 1, wherein said first bypass transistor is an n-channel field-effect transistor.

5. The integrated circuit of claim 1, wherein said current-to-voltage converter comprises an n-channel field-effect series transistor interposed between said precharging circuit and said input terminal; and logic circuitry connected to drive a gate of said series transistor with a signal which varies inversely with the voltage of said input terminal.

6. An integrated circuit, comprising:

an array of memory cells arranged in rows and columns;

one or more precharging and reading subcircuits, each operatively connected to at least one respective column of said array of memory cells, and each comprising:

a current-to-voltage converter having an input terminal connected to be driven by a current signal from said respective column, and having an output terminal connected to provide a voltage signal corresponding to said current signal when an enable signal is active, a precharging circuit connected to selectably drive said voltage signal toward a power supply voltage, a read circuit connected to detect the voltage of said voltage signal and provide a corresponding digital output through an output register, a first bypass transistor connected to selectably bypass said read circuit and said output register, but not said current-to-voltage converter, under control of a first test-mode control signal; and an output terminal operatively connected to said digital output;

wherein said precharging circuit is controlled in dependence both on a clock signal and also on a second test-mode control signal.

7. The integrated circuit of claim 6, wherein said array of memory cells consists of an array of floating-gate memory cells.

8. The integrated circuit of claim 6, wherein each said precharging/reading subcircuit is connected to a plurality of column-select transistors which are each connected to a respective column of said array of memory cells.

9. The integrated circuit of claim 6, wherein said first bypass transistor is an n-channel field-effect transistor.

10. The integrated circuit of claim 6, wherein said current-to-voltage converter comprises an n-channel field-effect series transistor interposed between said precharging circuit and said input terminal; and logic circuitry connected to drive a gate of said series transistor with a signal which varies inversely with the voltage of said input terminal.

11. An integrated circuit memory, comprising:

an array of memory cells; and one or more precharging and reading subcircuits, each selectably connected to multiple respective multi-cell portions of said array of memory cells, and each comprising:

an impedance element having an input terminal connected to be driven by said respective portion of said array, and having an output terminal connected to provide a voltage signal which indicates signals received at said input terminal;

a precharging circuit connected to selectably drive said voltage signal toward a power supply voltage, a read circuit connected to detect the voltage of said voltage signal and provide a corresponding digital output, a first bypass transistor connected to selectably bypass said read circuit, but not said impedance element, under control of a first test-mode control signal; and an output terminal operatively connected to said digital output;

wherein said precharging circuit is controlled in dependence both on a clock signal and also on a second test-mode control signal.

12. The integrated circuit of claim 11, wherein said array of memory cells consists of an array of floating-gate memory cells.

13. The integrated circuit of claim 11, wherein each said precharging/reading subcircuit is connected to a plurality of column-select transistors which are each connected to a respective column of said array of memory cells.

14. The integrated circuit of claim 11, wherein said first bypass transistor is an n-channel field-effect transistor.

15. The integrated circuit of claim 11, wherein said impedance element comprises an n-channel field-effect series transistor interposed between said precharging circuit and said input terminal; and logic circuitry connected to drive a gate of said series transistor with a signal which varies inversely with the voltage of said input terminal.

16. A memory in integrated circuit form organized as a matrix in rows and columns and comprising:

at least one precharging and reading device associated with one or more rows, said device comprising a precharging element, a current-voltage converter and a read circuit, the selection of an associated row activating the precharging element and connecting the input of said converter to said row, the output of said converter being connected to the precharging element and to the input of the read circuit; and a test circuit connected to isolate the output of the converter from the precharging element and from the reading circuit, apply a test voltage to the output of the converter and measure a current at this output.

17. The memory of claim 16, wherein said test circuit comprises a transistor controlled by a test signal to cut off the logic supply of the read circuit.

18. The memory of claim 16, wherein said test circuit comprises a logic gate receiving a test signal to set the precharging element in the inactive state.

19. The memory of claim 16, wherein the test circuit further comprises another logic gate controlled by a test signal to cut off the input of the converter from its output, the test circuit then enabling the application, by the isolating of the read circuit from the output of the converter, of a test voltage to this output and the measurement therein of the current coming from the precharging element.

20. The memory of claim 16, the precharging device being connected to an input/output pin of the memory, wherein the test circuit furthermore comprises at least one transistor connected between the output of the converter and said pin and controlled by the test signal applied to the transistor to cut off the supply of the read circuit, apply the test voltage to said input/output pin and measure the current therein.

21. A method to measure the current of a cell of a memory in integrated circuit form comprising a device for the precharging and reading of said memory cell, said device comprising a precharging element, a current-voltage converter and a read circuit, said method comprising the steps of:

selecting said cell;

activating the precharging element;

connecting the input of said converter to said row, the output of said converter being connected to the precharging element and to the input of the read circuit;

applying a testing voltage to the output of said converter; and measuring the current therein, while the precharging element and the reading circuit are set in the inactive state.

22. The method of claim 21, wherein the measurement of the current in the precharging element as a function of a test voltage applied to the output of the converter is carried out by having the reading circuit being inactive and the input of said converter being isolated from its output.

* * * * *